United States Patent
Ballantyne

(10) Patent No.: US 6,983,024 B2
(45) Date of Patent: Jan. 3, 2006

(54) QUADRA-POLAR MODULATOR

(75) Inventor: Gary J. Ballantyne, Christchurch (NZ)

(73) Assignee: Qualcomm Inc., San Diego, CA (US)

( * ) Notice: Subject to any disclaimer, the term of this patent is extended or adjusted under 35 U.S.C. 154(b) by 226 days.

(21) Appl. No.: 10/392,042

(22) Filed: Mar. 18, 2003

(65) Prior Publication Data

US 2004/0184559 A1    Sep. 23, 2004

(51) Int. Cl.
H04L 5/12    (2006.01)
(52) U.S. Cl. .................. 375/261; 375/300; 332/103; 332/155; 455/108
(58) Field of Classification Search ................ 375/261, 375/268, 295, 300; 332/103, 149, 155; 455/73, 455/88, 91, 103, 104, 108
See application file for complete search history.

(56) References Cited

U.S. PATENT DOCUMENTS

| | | | | |
|---|---|---|---|---|
| 4,358,853 A | * | 11/1982 | Qureshi | ...................... 375/296 |
| 4,638,504 A | * | 1/1987 | Salek | ........................... 381/16 |
| 5,574,755 A | | 11/1996 | Persico | |
| 6,430,228 B1 | * | 8/2002 | Zhang | ......................... 375/261 |

OTHER PUBLICATIONS

C.J. Wei, et al., *Analysis and Experimental Waveform Study TUIF-33 of Inverse Class Class-F Mode of Microwave Power Fets*; 2000 IEEE MTT-S Digest: pp. 525-528.

Ichiro Aoki, et al., *Fully Integrated CMOS Power Amplifier Design Using the Distributed Active-Transformer Archictecture*; IEEE Journal of Solid State Circuits vol. 37, No. 3:371-383 (2002).

* cited by examiner

Primary Examiner—Dac V. Ha
(74) Attorney, Agent, or Firm—Philip R Wadsworth; Charles D Brown; George C Pappas

(57) ABSTRACT

A quadra-polar modulator that is simple to implement and also provides good noise performance. The quadra-polar modulator includes four amplitude modulators and a combiner. Each amplitude modulator modulates a respective carrier signal with a respective input signal to provide a respective output signal. The combiner then combines the four output signals from the four amplitude modulators to provide a modulated signal. Each amplitude modulator may be implemented with a switching amplifier, such as a supply modulated class E amplifier. Two input signals are obtained by summing separately an inphase (I) modulating signal and an inverted I modulating signal with an offset value. The other two input signals are obtained by summing separately a quadrature (Q) modulating signal and an inverted Q modulating signal with the offset value. The offset value can be selected based on the expected magnitude of the modulating signals. The four carrier signals are in quadrature to each other.

26 Claims, 6 Drawing Sheets

QUADRA-POLAR MODULATOR

BACKGROUND

I. Field

The present invention relates generally to electronic circuits, and more specifically to a quadra-polar modulator for use in communication systems.

II. Background

In a typical communication system, traffic data is first processed digitally to obtain coded data. The coded data is then used to modulate a carrier signal to obtain a modulated signal that is more suitable for transmission over a communication link. Modulation may be broadly defined as a process whereby one or more characteristics of a carrier signal are varied in accordance with a modulating wave (see also, IEEE Standard Dictionary of Electrical and Electronic Terms). The carrier signal is typically a periodic signal (e.g., a sinusoidal signal) of a particular frequency. The modulating wave may be derived from the coded data and may be provided as an inphase (I) modulating signal and a quadrature (Q) modulating signal. Typically, the amplitude and/or the phase of the carrier signal are varied by the modulating signals. Information would then reside in the changes in the amplitude and/or the phase of the carrier signal.

Various architectures or schemes may be used to modulate a carrier signal with data. These architectures include quadrature amplitude (QAM), polar, and linear amplification with nonlinear components (LINC) architectures. Of these three modulator architectures, the QAM architecture is the easiest to implement because it can accept the I and Q modulating signals without any pre-processing. However, this architecture may suffer from poor noise and power performance. The polar architecture requires complex pre-processing of the I and Q modulating signals but, if properly implemented, can provide good noise and power performance. The LINC architecture also requires complex pre-processing of the I and Q modulating signals and is not in commercial use at the present time. These modulator architectures are described in further detail below.

Each of the three modulator architectures described above uses different circuitry to perform modulation and has certain advantages and disadvantages relating to implementation complexity and performance. It would thus be highly desirable to have a modulator architecture that can be implemented easily and can also provide good noise and power performance.

SUMMARY

A quadra-polar modulator is provided herein having key advantages from both the QAM and polar modulators. In particular, the quadra-polar modulator is simple to implement since it can accept the I and Q modulating signals without requiring complicated pre-processing of these signals. The quadra-polar modulator can also provide good noise performance and output power comparable to that of a polar modulator.

An embodiment provides an integrated circuit comprised of four amplitude modulators and a combiner used to implement a quadra-polar modulator. Each amplitude modulator receives and amplitude modulates a respective carrier signal $W_i(t)$ with a respective input signal $V_i(t)$ to provide a respective output signal $X_i(t)$, where i=1, 2, 3, 4. The combiner then combines the four output signals from the four amplitude modulators to provide a modulated signal Y(t). Each amplitude modulator may be implemented with a switching amplifier, such as a supply modulated class E amplifier.

Two of the four input signals can be obtained by summing separately the I modulating signal, $A_I(t)$, and an inverted I modulating signal, $-A_I(t)$, with an offset value. The other two input signals can be obtained by summing separately the Q modulating signal, $A_Q(t)$, and an inverted Q modulating signal, $-A_Q(t)$, with the offset value. The offset value may be selected based on the expected magnitude of the I and Q modulating signals. The four carrier signals are in mutual quadrature (i.e., relative to one carrier signal, the other three carrier signals are at 90, 180 and 270 degrees).

The quadra-polar modulator may be used for various wireless communication systems (e.g., CDMA systems, GSM systems, and so on). The modulated signal may be a CDMA signal, a GSM signal, or some other signal for some other system.

Various aspects and embodiments of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Figure 1:
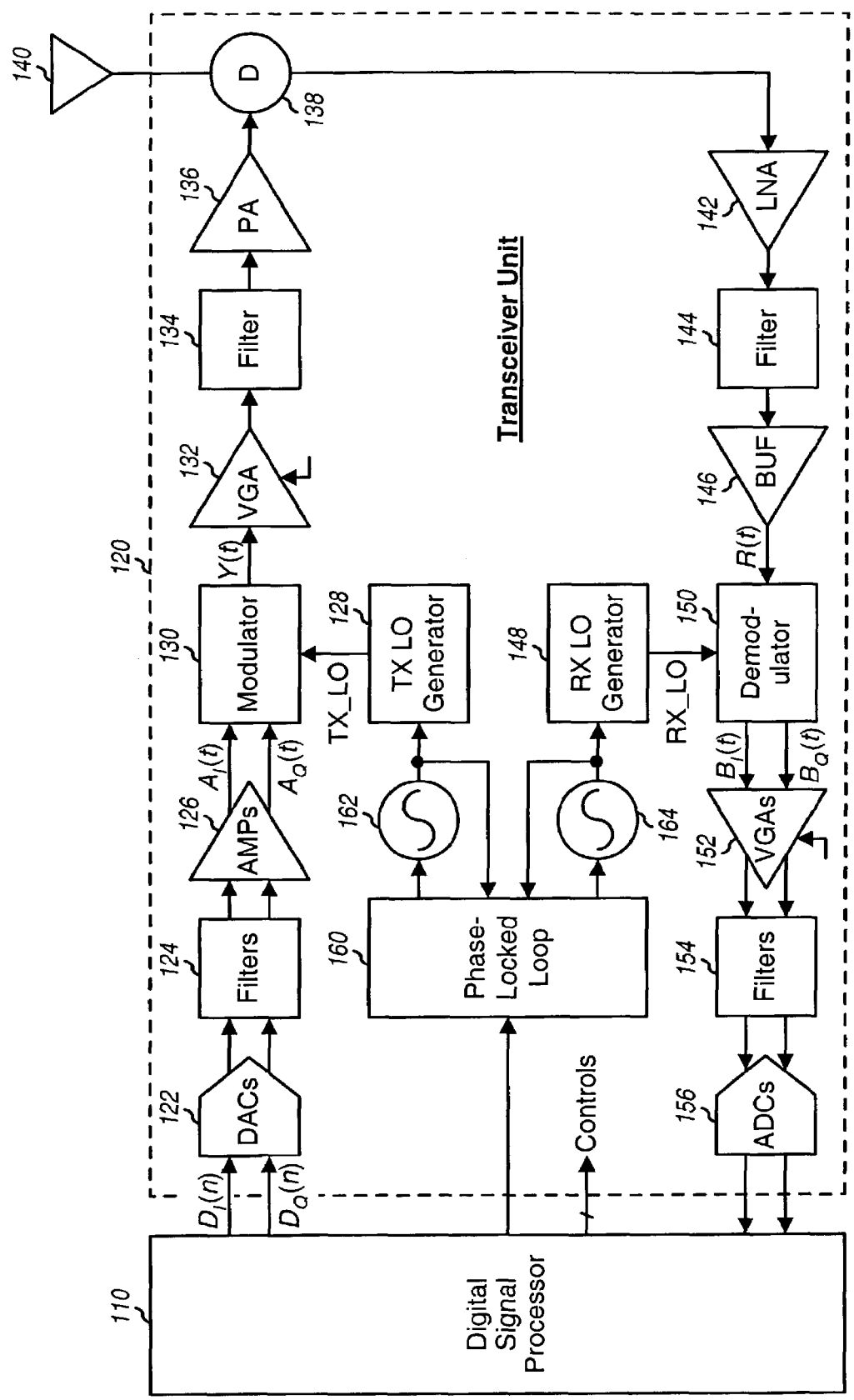
FIG. 1 shows a block diagram of a transceiver unit that may be used for wireless communication.

FIG. 1 shows a block diagram of an embodiment of a transceiver unit 120 that may be used for wireless communication. Transceiver unit 120 includes a transmitter for data transmission and a receiver for data reception. Transceiver unit 120 may be used in a terminal (e.g., a cellular phone or handset) or a base station in a CDMA system, and may also be used in other devices for other communication systems.

In the transmit path, a digital signal processor (DSP) 110 provides traffic data as I and Q data streams, which are denoted as $D_I(n)$ and $D_Q(n)$. The I and Q data streams are converted to I and Q analog signals by digital-to-analog converters (DACs) 122, filtered by filters 124 to remove images caused by the digital-to-analog conversion, and amplified by amplifiers (AMPs) 126 to provide I and Q modulating signals, which are denoted as $A_I(t)$ and $A_Q(t)$.

A modulator 130 receives the I and Q modulating signals from amplifiers 126 and a TX_LO signal from a transmit (TX) local oscillator (LO) generator 128. Modulator 130 modulates the TX_LO signal with the I and Q modulating signals to generate a modulated signal, which is denoted as Y(t). The modulated signal is then amplified by a variable gain amplifier (VGA) 132, filtered by a filter 134, and further amplified by a power amplifier (PA) 136 to generate an output modulated signal. The output modulated signal is then routed through a duplexer (D) 138 and transmitted from an antenna 140.

On the receive path, a transmitted signal is received by antenna 140, routed through duplexer 138, amplified by a low noise amplifier (LNA) 142, filtered by a filter 144, and buffered by a buffer (BUF) 146 to provide a received signal, which is denoted as R(t). A demodulator 150 is provided with the received signal R(t) by buffer 146 and an RX_LO signal by a receive (RX) LO generator 148. Demodulator 150 then demodulates the received signal R(t) with the RX_LO signal to obtain I and Q baseband signals, which are denoted as $B_I(t)$ and $B_Q(t)$. The I and Q baseband signals are then amplified by VGAs 152, filtered by filters 154, and digitized by analog-to-digital converters (ADCs) 156 to provide data samples. The data samples are then provided to digital signal processor 110 for further processing.

Voltage controlled oscillators (VCOs) 162 and 164 provide VCO signals used to generate the TX_LO and RX_LO signals, which are used for modulation and demodulation, respectively. Each VCO signal and each LO signal is a periodic signal with a particular fundamental frequency and may be of any waveform type (e.g., sinusoidal, square wave, sawtooth, and so on). In a CDMA system, different frequencies are used for the forward link (i.e., downlink) and reverse link (i.e., uplink). The VCO signals from VCOs 162 and 164 may have the same or different frequencies, depending on the design of transceiver unit 120. A phase locked loop (PLL) unit 160 receives timing information from digital signal processor 110, and feedback from VCOs 162 and 164, and provides controls used to adjust the frequency and/or phase of VCOs 162 and 164.

FIG. 1 shows a specific transceiver design. In a typical transceiver, the conditioning of the signals in the transmit and receive paths may be performed by one or more stages of amplifier, filter, and so on. These components may be arranged in a manner different from that shown in FIG. 1, as is known in the art. Moreover, other circuit blocks not shown in FIG. 1 may also be used to condition the signals in the transmit and receive paths.

For simplicity, FIG. 1 also shows direct conversion being used for both the transmit and receive paths. In the transmit path, the modulation is shown as being performed directly at RF to obtain the output modulated signal at the desired RF frequency. In the receive path, the demodulation is shown as being performed directly at RF on the received signal to obtain the I and Q baseband signals. For a super-heterodyne transceiver architecture (not shown in FIG. 1), the modulation and demodulation are performed at an intermediate frequency (IF) instead of RF. In this case, in the transmit path, the modulator would provide an IF modulated signal, which is then frequency upconverted to obtain the RF output modulated signal. In the receive path, the RF received signal would be frequency downconverted to obtain an IF received signal, which would then be demodulated by the demodulator to provide the I and Q baseband signals.

Figure 2A:
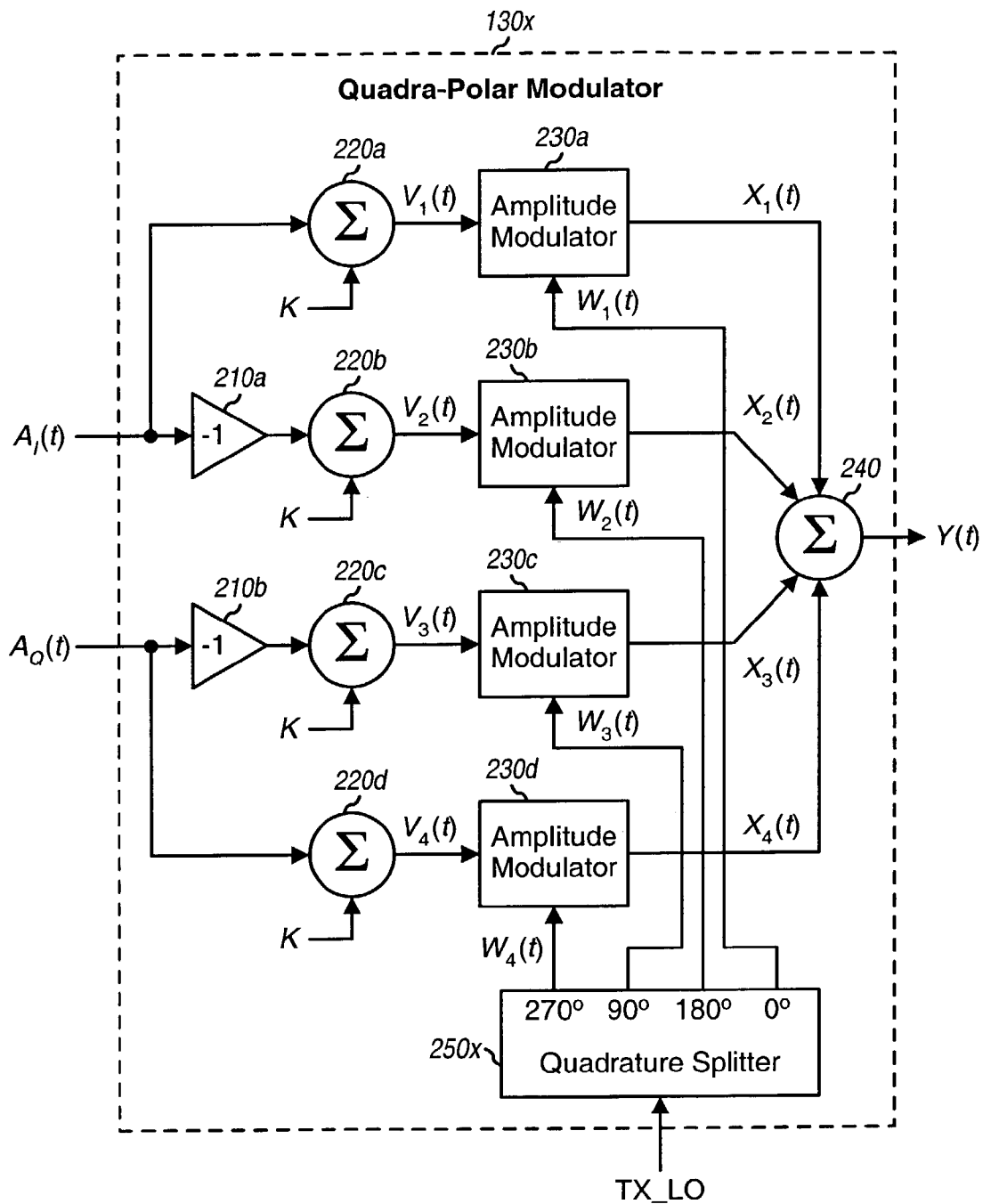
FIGS. 2A and 2B show block diagrams of two embodiments of a quadra-polar modulator.

FIG. 2A shows a block diagram of an embodiment of a quadra-polar modulator 130x, which may be used for modulator 130 in FIG. 1. Quadra-polar modulator 130x may be designed to operate at IF or RF, depending on the design of the transceiver unit.

Within quadra-polar modulator 130x, the I modulating signal, $A_I(t)$, is provided to an inverting amplifier 210a and a summer 220a. Summer 220a sums the signal $A_I(t)$ with an offset value K to provide a first intermediate signal, $V_1(t)$. A summer 220b receives and sums an inverted I modulating signal, $-A_I(t)$, from amplifier 210a with the offset value K to provide a second intermediate signal, $V_2(t)$. Similarly, the Q modulating signal, $A_Q(t)$, is provided to an inverting amplifier 210b and a summer 220d. A summer 220c receives and sums an inverted Q modulating signal, $-A_Q(t)$, from amplifier 210b with the offset value K to provide a third intermediate signal, $V_3(t)$. Summer 220d sums the signal $A_Q(t)$ with the offset value K to provide a fourth intermediate signal, $V_4(t)$. The four intermediate signals may be expressed as:

$$V_1(t) = K + A_I(t),$$

$$V_2(t) = K - A_I(t),$$

$$V_3(t) = K - A_Q(t), \text{ and}$$

$$V_4(t) = K + A_Q(t).$$

Eq (1)

The offset value K is selected such that the expected magnitude of the intermediate signals is greater than a particular minimum voltage. This condition maybe given as: $V_1(t), \ldots V_4(t) > V_{min} > 0$, for all t, where $V_{min}$ is the minimum voltage (or current) required for amplitude modulators 230 to function properly. The offset value K may thus be selected based on the expected magnitude of the I and Q modulating signals. In general, a smaller value is selected for K for smaller I and Q modulating signals and a larger value is selected for K for larger modulating signals. The offset value K may be a constant value (i.e., a fixed value). Alternatively, the offset value K may be a variable value that is adjusted based on the expected magnitude of the modulating signals (e.g., the offset value K may be adjusted based on a power control signal).

The four intermediate signals, $V_1(t)$ through $V_4(t)$, are respectively provided to four amplitude modulators 230a through 230d, which also respectively receive four carrier signals, $W_1(t)$ through $W_4(t)$, from a quadrature splitter 250x. The four carrier signals, $W_1(t)$ through $W_4(t)$, are 90° (i.e., quadrature) shifted versions of each other, and may be expressed as:

$$W_1(t) = \frac{1}{2}\cos(\omega t),$$

$$W_2(t) = -\frac{1}{2}\cos(\omega t),$$

$$W_3(t) = -\frac{1}{2}\sin(\omega t), \text{ and}$$

$$W_4(t) = \frac{1}{2}\sin(\omega t),$$

Eq (2)

where $\omega = 2\pi \cdot f_{LO}$, and $f_{LO}$ is the frequency of the TX_LO signal.

Each amplitude modulator 230 performs amplitude modulation on its carrier signal $W_i(t)$ with its intermediate signal $V_i(t)$ and provides a corresponding output signal $X_i(t)$, where i=1, 2, 3, 4. The four output signals, $X_1(t)$ through $X_4(t)$, from the four amplitude modulators 230a through 230d may be expressed as:

$$X_1(t) = \frac{1}{2}(K + A_1(t))\cos(\omega t),$$

$$X_2(t) = \frac{1}{2}(-K + A_1(t))\cos(\omega t),$$

Eq (3)

-continued $$X_3(t) = \frac{1}{2}(-K + A_Q(t))\sin(\omega t), \text{ and}$$

$$X_4(t) = \frac{1}{2}(K + A_Q(t))\sin(\omega t).$$

A summer 240 receives and sums the four output signals from amplitude modulators 230a through 230d to provide the modulated signal Y(t), which may be expressed as:

$$Y(t) = X_1(t) + X_2(t) + X_3(t) + X_4(t) \qquad \text{Eq (4)}$$
$$= A_1(t)\cos(\omega t) + A_Q(t)\sin(\omega t).$$

Equation (4) shows the modulated signal Y(t) having the desired quadrature modulation of the TX_LO signal.

Figure 2B:
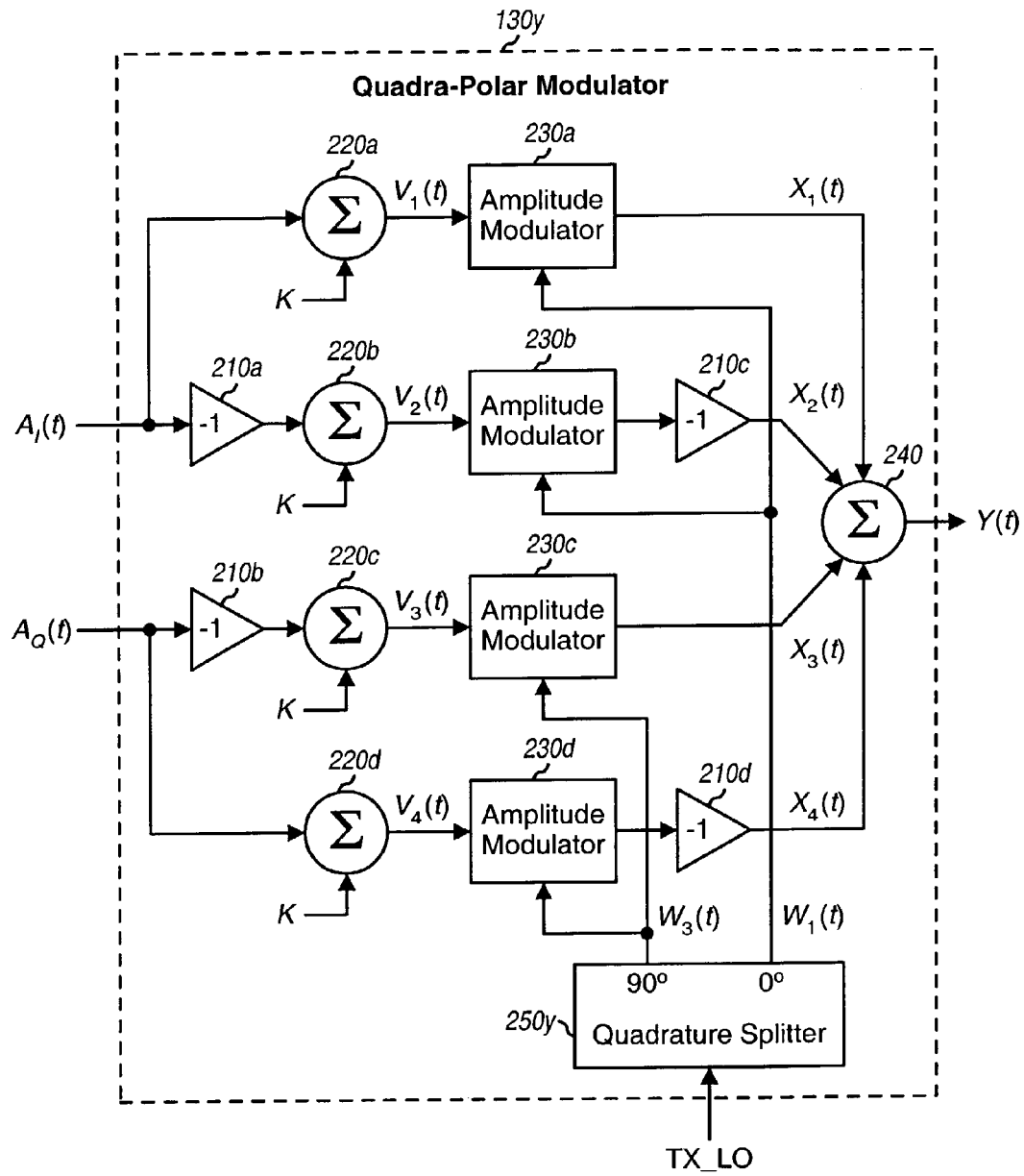

FIG. 2B shows a block diagram of another embodiment of a quadra-polar modulator 130y, which may also be used for modulator 130 in FIG. 1. Quadra-polar modulator 130y is similar to quadra-polar modulator 130x in FIG. 2A, but further includes (1) an inverting amplifier 210c coupled between the output of amplitude modulator 230b and the second input of sununer 240 and (2) an inverting amplifier 210d coupled between the output of amplitude modulator 230d and the fourth input of summer 240. Inverting amplifier 210c allows the same carrier signal $W_1(t)$ to be used for both amplitude modulators 230a and 230b, and inverting amplifier 210d allows the same carrier signal $W_3(t)$ to be used for both amplitude modulators 230c and 230d, where $W_3(t)$ is 90° out of phase with respect to $W_1(t)$. This may simplify the design of a quadrature splitter 250y used to provide the carrier signals $W_1(t)$ and $W_3(t)$ for quadra-polar modulator 130y. Inverting amplifiers 210c and 210d may be implemented by simply reversing the output signals $X_2(t)$ and $X_4(t)$ provided to summer 240 (e.g., reversing the transfonner coupling described in FIG. 3 below).

Other embodiments of the quadra-polar modulator may be designed by altering the signs of the additions/multiplications while still providing the desired modulated signal Y(t).

The components of quadra-polar modulators 130x and 130y may be implemented in various manners. Inverting amplifiers 210a and 210b may be implemented with various types of linear amplifiers, as is known in the art. Summers 220a through 220d and summer 240 may be implemented with active or passive circuits, depending on the implementation of the quadra-polar modulator. Quadrature splitters 250x and 250y may be implemented with conventional quadrature splitters. For example, quadrature splitters 250x and 250y may be implemented with a 90° phase shifter that receives a differential input LO signal and provides two differential output LO signals that are in quadrature of each other.

Amplitude modulators 230a through 230d may be implemented with switching amplifiers, other types of amplifier, multipliers, mixers, or other circuits. For example, amplitude modulators 230 may be implemented with switching amplifiers having power supply that can be modulated. The switching amplifiers may be class D, class E, or class F amplifiers, all of which are described by H. Krauss et al in a book entitled "Solid State Radio Engineering," John Wiley & Sons, 1980. The switching amplifiers may also be inverse class F amplifiers, which are described by Wei et al in a paper entitled "Analysis and experimental waveform study on inverse class class-F mode of microwave power FETs," 2000 IEEE MTT-S International Microwave Symposium Digest, vol. 1, 2000, pages 525–528. An example of a class E/inverse-F hybrid (class $E/F_{odd}$) switching amplifier that may be used for each amplitude modulator 230 is described by I. Aoki et al. in a paper entitled "Fully Integrated CMOS Power Amplifier Design Using the Distributed Active-Transformer Architecture," IEEE Journal of Solid State Circuits, 37(3), March 2002, pages 371–383. These book and papers are incorporated herein by reference. If a switching amplifier is used for each amplitude modulator 230, then the carrier signal $W_i(t)$ may be used to switch the amplifier and the intermediate signal $V_i(t)$ may be used to modulate the voltage (or current) supply of the amplifier.

A key characteristic of an amplitude modulator is that it modulates a carrier signal without inverting the phase of the carrier signal. This is in contrast to a four-quadrant multiplier, such as a Gilbert cell multiplier, which can invert the phase of the carrier signal when the modulating signal reverses polarity or falls below a particular threshold.

FIGS. 2A and 2B show symbolic representations of the quadra-polar modulator, which may be implemented with various circuit designs. Depending on the specific design, different circuits and signals may be used to implement the quadra-polar modulator. Moreover, the signal flow may be different from that shown in FIGS. 2A and 2B.

Figure 3:
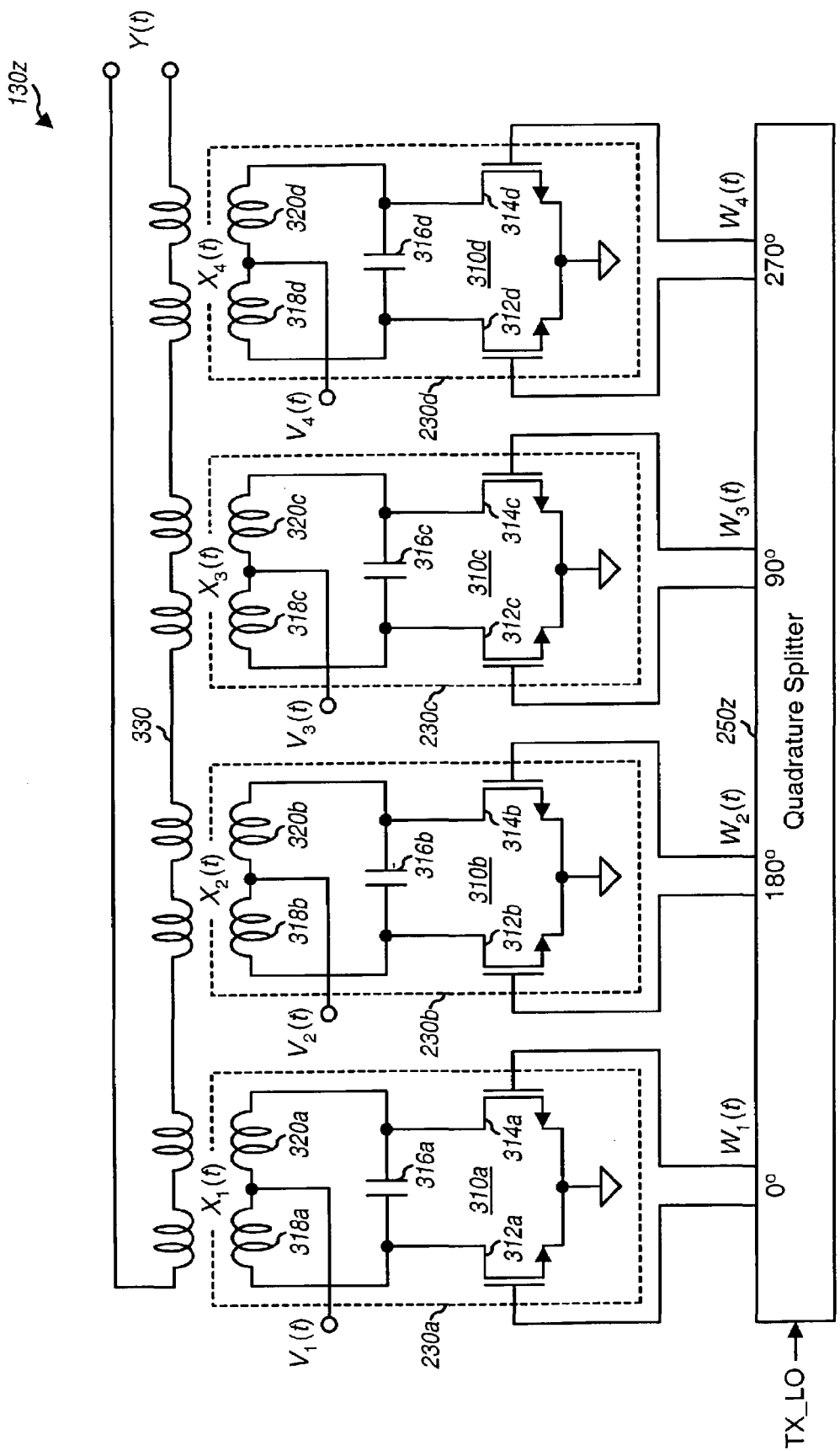
FIG. 3 shows a schematic diagram of a design for the quadra-polar modulator.

FIG. 3 shows a schematic diagram of a portion of a quadra-polar modulator 130z, which is an embodiment of quadra-polar modulator 130x in FIG. 2A. For simplicity, the circuitry used to generate the four intermediate signals, $V_1(t)$ through $V_4(t)$, (i.e., inverting amplifiers 210a and 210b and summers 220a through 220d in FIG. 2A) is not shown in FIG. 3.

In the embodiment shown in FIG. 3, each amplitude modulator 230 is implemented with a supply modulated class $E/F_{odd}$ switching amplifier. The switching amplifier includes a differential pair 310, a capacitor 316, and inductors 318 and 320. Differential pair 310 is formed by two transistors 312 and 314 having sources that couple to AC ground, gates that receive a differential carrier signal $W_i(t)$, and drains that couple to the two ends of capacitor 316. One end of inductor 318 couples to the drain of transistor 312 and the other end couples to the amplifier supply. One end of inductor 320 couples to the drain of transistor 314 and the other end couples to the amplifier supply. The amplifier supply is provided with the intermediate signal $V_i(t)$. To overcome certain practicalities, each amplitude modulator 230 may be a circular composite of several push-pull stages, as described in the aforementioned paper by Aoki et al.

Each switching amplifier 230 is driven by a respective differential carrier signal $W_i(t)$ provided by a quadrature splitter 250z and further amplitude modulated by a respective intermediate signal $V_i(t)$. Capacitor 316 and inductors 318 and 320 form a tank circuit that is tuned to the frequency of the TX_LO signal. The tank circuit operates to (1) pass the desired components at the frequency to which it is tuned, (2) filter out the undesired components at other frequencies and other spurious signals and noise, and (3) shape the waveforms according to the class $E/F_{odd}$ technique.

For the embodiment shown in FIG. 3, the four output signals, $X_1(t)$ through $X_4(t)$, from the four amplitude modulators 230a through 230d are combined via a transformer 330 to obtain the modulated signal Y(t). Transformer 330 may be fabricated as a metal loop that picks up the magnetic field generated by inductors 318 and 320 within the four amplitude modulators 230a through 230d. The output signals may also be combined in other manners. For example, the output signals from the four differential pairs 310a through 310d may be combined by an active circuit (e.g., a summing amplifier) to provide the modulated signal Y(t).

Quadrature splitter 250z provides four differential carrier signals, $W_1(t)$ through $W_4(t)$, for the four amplitude modulators 230a through 230d, respectively. The first pair of carrier signals, $W_1(t)$ and $W_2(t)$, may be derived from a first differential carrier signal (with the signal lines swapped), and the second pair of carrier signals, $W_3(t)$ and $W_4(t)$, may also be derived from a second differential carrier signal that is 90° out of phase with the first differential carrier signal.

FIG. 3 shows a specific design whereby quadra-polar modulator 130z is implemented with N-channel transistors. The quadra-polar modulator may also be implemented with other circuit designs, and this is within the scope of the invention. In general, the quadra-polar modulator may be implemented using any process technology including complementary metal oxide semiconductor (CMOS), bipolar, bipolar-CMOS (BiCMOS), gallium arsenide (GaAs), hetero-junction bipolar transistor (BBT), and so on. The quadra-polar modulator may also be implemented with micro-electro-mechanical (MEMS) switches for the switching amplifiers.

For simplicity, quadra-polar modulators 130x, 130y, and 130z in FIGS. 2A, 2B, and 3, respectively, are shown to include quadrature splitters 250x, 250y, and 250z, respectively. However, the quadrature splitter may be part of TX_LO generator 128.

The quadra-polar modulator may be used in a transmitter in which it is necessary to control the power level of the RF modulated signal. Power control may be achieved, to an extent, by adjusting the signal level of the I and Q modulating signals, $A_I(t)$ and $A_Q(t)$, provided to the quadra-polar modulator. To achieve good result, the offset value K may be adjusted correspondingly based on the expected signal level of $A_I(t)$ and $A_Q(t)$. In particular, the offset value K may be selected to be as small as possible while conforming to the condition $V_1(t), \ldots V_4(t) > V_{min} > 0$.

Figure 4:
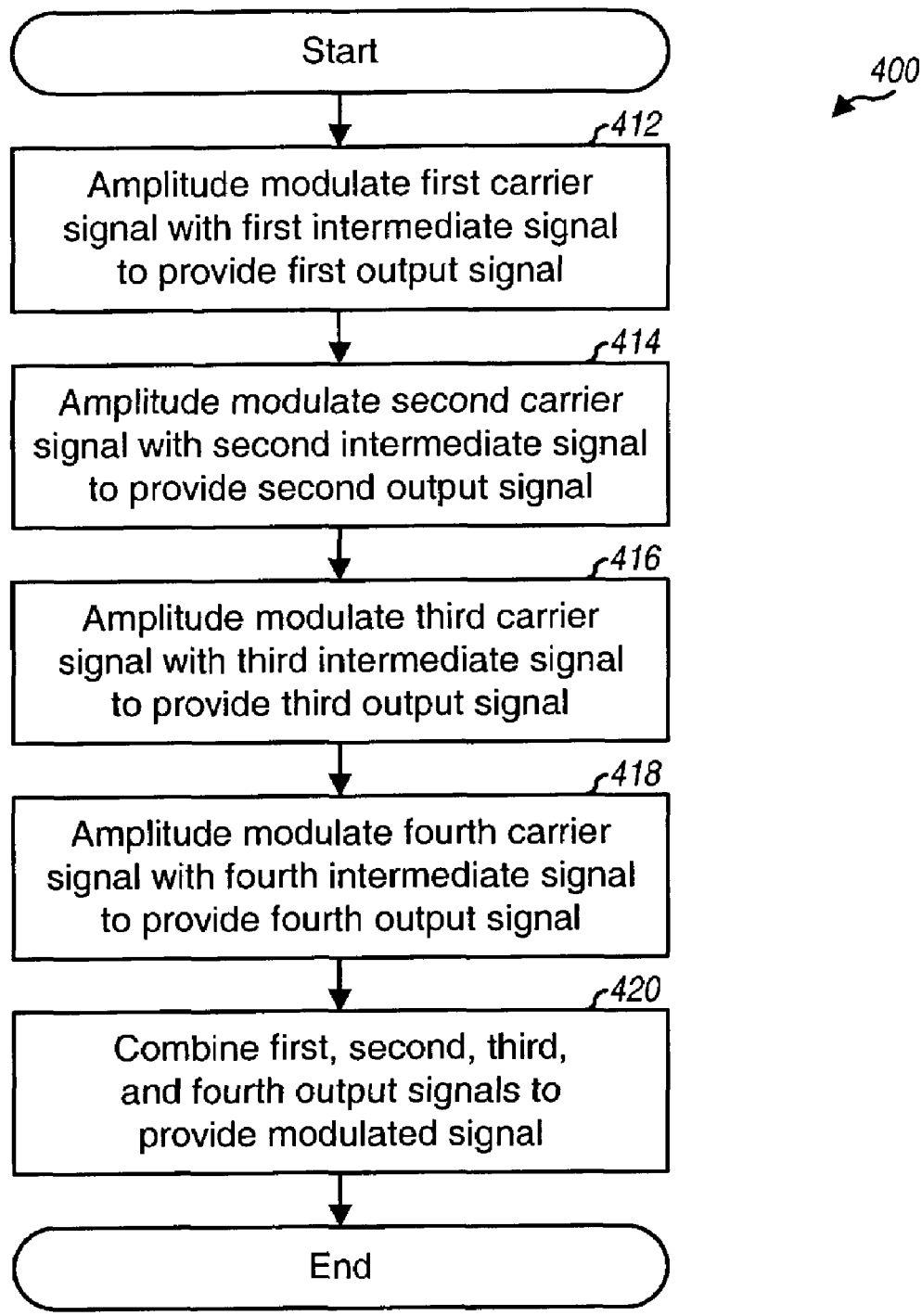
FIG. 4 shows an embodiment of a process 400 for performing modulation based on the quadra-polar architecture.

FIG. 4 shows an embodiment of a process 400 for performing modulation based on the quadra-polar architecture. The first carrier signal $W_1(t)$ is amplitude modulated with the first intermediate signal $V_1(t)$ to provide the first output signal $X_1(t)$ (step 412). The second carrier signal $W_2(t)$ is amplitude modulated with the second intermediate signal $V_2(t)$ to provide the second output signal $X_2(t)$ (step 414). The first and second input signals may be derived based on the first modulating signal $A_1(t)$, for example, as shown in equation (1).

The third carrier signal $W_3(t)$ is amplitude modulated with the third intermediate signal $V_3(t)$ to provide the third output signal $X_3(t)$ (step 416). The fourth carrier signal $W_4(t)$ is amplitude modulated with the fourth intermediate signal $V_4(t)$ to provide the fourth output signal $X_4(t)$ (step 418). The third and fourth input signals may be derived based on the second modulating signal $A_Q(t)$, for example, as shown in equation (1). The first, second, third, and fourth output signals are then combined to provide the modulated signal, for example, as shown in equation (4) (step 420).

The first, second, third, and fourth carrier signals may be derived as shown in equation (2). Alternatively, the first and second carrier signals may be one carrier signal, and the third and fourth carrier signals may be another carrier signal, for example, as shown in FIG. 2B. Different intermediate and carrier signals may be used for different topologies of the quadra-polar modulator, for example, as shown in FIGS. 2A and 2B.

The quadra-polar modulator may be used in an error-driven negative feedback system. Negative feedback may be used to obtain various benefits, such as improved linearity for the transmitter circuitry used after the quadra-polar modulator in the transmit path.

Figure 5:
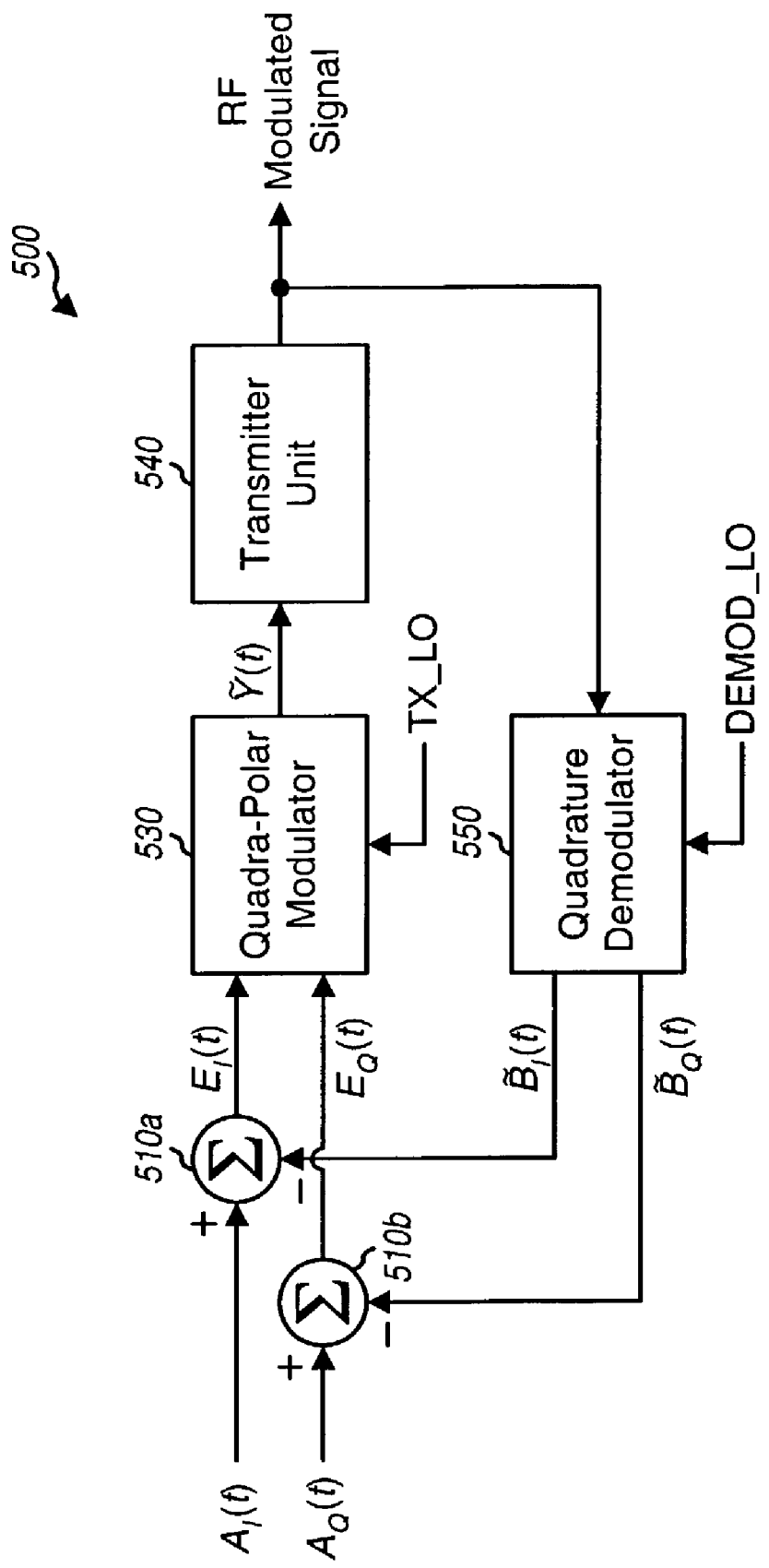
FIG. 5 shows a block diagram of a feedback system that may be used for the quadra-polar modulator.

FIG. 5 shows a block diagram of an embodiment of a feedback system 500 that may be used for the quadra-polar modulator. System 500 implements Cartesian feedback and accepts the I and Q modulating signals, which are on a Cartesian (i.e., quadrature or orthogonal) coordinate system.

For system 500, the I and Q modulating signals, $A_I(t)$ and $A_Q(t)$, are respectively provided to summers 510a and 510b, which also respectively receive I and Q demodulated signals, $B_I(t)$ and $B_Q(t)$, from a quadrature demodulator 550. Summer 510a subtracts the I demodulated signal, $B_I(t)$, from the I modulating signal, $A_I(t)$, to provide an I error signal, $E_I(t)$. Similarly, summer 510b subtracts the Q demodulated signal, $B_Q(t)$, from the Q modulating signal, $A_Q(t)$, to provide a Q error signal, $E_Q(t)$.

A quadra-polar modulator 530 receives the I and Q error signals, $E_I(t)$ and $E_Q(t)$, from summers 510a and 510b and the TX_LO signal. Quadra-polar modulator 530 then performs modulation in a manner described above and provides the modulated signal Y(t). Quadra-polar modulator 530 may be implemented with quadra-polar modulator 130x in FIG. 2A, quadra-polar modulator 130y in FIG. 2B, or quadra-polar modulator 130z in FIG. 3. The modulated signal Y(t) is further processed (e.g., filtered, amplified, frequency upconverted, and so on) by a transmitter unit 540 to provide an RF modulated signal. For example, transmitter unit 540 may include VGA 132, filter 134, power amplifier 136, and duplexer 138 shown in FIG. 1. The circuits within transmitter unit 540 may be associated with non-linearity that may be remedied (to an extent) by the use of negative feedback.

Quadrature demodulator 550 receives the RF modulated signal from transmitter unit 540 and performs quadrature demodulation using a DEMOD_LO signal to provide the I and Q demodulated signals, $B_I(t)$ and $B_Q(t)$. The DEMOD_LO signal and TX_LO signal may have different frequencies, for example, if frequency upconversion is performed by transmitter unit 540.

As shown in FIG. 5, quadra-polar modulator 530 is driven with the I and Q error signals instead of the I and Q modulating signals. The error signals are generated such that they can compensate for non-linearity in the forward path, including non-linearity in transmitter unit 540. Quadrature demodulator 550 in the feedback path needs to be of high quality to achieve good results.

The quadra-polar architecture described herein achieves the joint goals of minimizing pre-processing of the I and Q modulating signals while providing good output noise and output power performance. As shown in FIGS. 2A and 2B and equations (1) through (3), only limited and simple pre-processing of the I and Q modulating signals with inverting amplifiers and summers is required for the quadra-polar modulator. High output power is readily achievable when switching amplifiers are employed as the amplitude modulators in the quadra-polar modulator.

The quadra-polar modulator is also expected to have noise performance similar to that of a polar modulator. It can be shown that the output noise in the modulated signal Y(t) is the sum of the noise from the four amplitude modulators 230a through 230d. Consider noise in the TX_LO signal that is a sinusoid at a particular frequency offset. If the frequency offset is not too large, then the noise sinusoid is amplitude modulated in the same manner as the TX_LO signal.

If the noise contribution from the quadrature splitter and the amplitude modulators is negligible, then the carrier-to-noise ratio (C/N) at the output of the quadra-polar modulator is approximately the same as the C/N of the TX_LO signal. In a conventional polar modulator, which is often implemented with a phase modulator and an amplitude modulator, the C/N at the polar modulator output is also approximately the same as that of the TX_LO signal. This assumes that the phase modulator (e.g., a phase-lock loop (PLL)) and the amplitude modulator (e.g., a supply modulated class E amplifier) contribute negligible noise. The quadra-polar modulator can thus achieve noise performance comparable to that of a polar modulator, albeit without requiring complicated pre-processing of the I and Q modulating signals.

For the QAM architecture, the I and Q modulating signals are used to directly modulate I and Q carrier signals to obtain a modulated signal S(t), which may be expressed as:

$$S(t) = A_I(t)\cos(\omega t) + A_Q(t)\sin(\omega t). \quad \text{Eq (5)}$$

For a QAM modulator, the I and Q modulating signals are used to directly modulate the I and Q carrier signals, respectively, with four-quadrant multipliers (e.g., mixers) to obtain I and Q modulated components. The modulated components are in quadrature (i.e., 90° out of phase of each other) and, when combined, result in the modulated signal S(t) that is both amplitude and phase modulated. The QAM architecture is simple to implement but suffers from poor wideband noise performance and low output power, which results from limitations of the mixer circuits.

For the polar architecture, the modulated signal S(t) may be expressed in a form to explicitly show the amplitude and phase modulation, as follows:

$$S(t) = A(t)\cos(\omega t + \phi(t)), \quad \text{Eq (6)}$$

where $$A(t) = \sqrt{A_I^2(t) + A_Q^2(t)}, \text{ and} \quad \text{Eq (7)}$$

$$\phi(t) = \arctan\left(\frac{A_Q(t)}{A_I(t)}\right). \quad \text{Eq (8)}$$

As shown in equations (6) through (8), for the polar architecture, the I and Q modulating signals need to be pre-processed to obtain the signals A(t) and φ(t), which are then used to modulate the amplitude and phase, respectively, of the carrier signal cos(ωt). This pre-processing complicates the design of the polar modulator and makes it unattractive for many applications.

For the LINC architecture, the modulated signal S(t) may be expressed in another form, as follows:

$$S(t) = \frac{1}{2} A_{\text{MAX}} \cos(\omega t + \psi_1(t)) + \quad \text{Eq (9)}$$
$$\frac{1}{2} A_{\text{MAX}} \cos(\omega t + \psi_2(t)),$$

where $A_{MAX}$ is a carefully selected constant, $$\psi_1(t) = \phi(t) + \arctan\sqrt{\frac{A_{\text{MAX}}^2}{A^2(t)} - 1}, \text{ and} \quad \text{Eq (10)}$$

$$\psi_2(t) = \phi(t) - \arctan\sqrt{\frac{A_{\text{MAX}}^2}{A^2(t)} - 1}. \quad \text{Eq (11)}$$

Equations (9) through (11) indicate that the modulated signal S(t) is composed of two constant-amplitude phase-modulated carrier signals. The phase modulation $\psi_i(t)$ on each carrier signal is determined by the desired amplitude modulation A(t) and the desired phase modulation φ(t) on the carrier signal cos(ωt).

As shown in equations (9) through (11), for the LINC architecture, the I and Q modulating signals would need to be pre-processed to obtain the signals $\psi_1(t)$ and $\psi_2(t)$, which are then used to modulate the phase of two versions of the carrier signal cos(ω_c). This pre-processing also complicates the design of the LINC modulator and limits its use.

In summary, a QAM modulator tends to be noisy and have low output power when implemented with mixers, whereas polar and quadra-polar modulators may be less noisy and have greater output power when implemented with switching amplifiers. Switching amplifiers, when used as amplitude modulators, cannot invert phase. This limitation is not a problem for a polar modulator, but the amplitude and phase modulating signals for the polar modulator are difficult to compute. The quadra-polar modulator allows for use of switching amplifiers (which can provide good noise performance and high output power) without the difficult computation.

The quadra-polar modulator described herein may be used for various single-carrier and multi-carrier modulation schemes including (but not limited to) bi-phase shift keying (BPSK), quadrature phase shift keying (QPSK), M-ary phase shift keying (M-PSK), M-ary quadrature amplitude modulation (M-QAM), orthogonal frequency division multiplex (OFDM), and Gaussian minimum shift keying (GMSK). These modulation schemes are all known in the art.

The quadra-polar modulator described herein may also be used for various systems and applications. For example, the quadra-polar modulator may be used in wireless communication systems, such as cellular systems, orthogonal frequency division multiple access (OFDMA) systems, OFDM systems, multiple-input multiple-output (MIMO) systems, wireless local area networks (LANs), and so on. The cellular systems include CDMA and GSM systems, and the CDMA systems include IS-95, IS-2000, IS-856, and W-CDMA systems. The modulated signal Y(t) provided by the quadra-polar modulator may be a CDMA signal for a CDMA system, a GSM signal for a GSM system, an OFDM signal for an OFDM or OFDMA system, or some other type of signal for some other system.

The quadra-polar modulator described herein may be implemented within an integrated circuit (IC), an application specific integrated circuit (ASIC), a digital signal processor (DSP), a digital signal processing device (DSPD), a programmable logic device (PLD), a field programmable gate array (FPGA), or other electronic units designed to perform the functions described herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a first amplitude modulator operative to amplitude modulate a first carrier signal with a first input signal to provide a first output signal, wherein the phase of the first carrier signal is not inverted by the first input signal;
   a second amplitude modulator operative to amplitude modulate a second carrier signal with a second input signal to provide a second output signal, wherein the first and second input signals are derived based on a first modulating signal, and wherein the chase of the second carrier signal is not inverted by the second input signal;
   a third amplitude modulator operative to amplitude modulate a third carrier signal with a third input signal to provide a third output signal, wherein the phase of the third carrier signal is not inverted by the third input signal;
   a fourth amplitude modulator operative to amplitude modulate a fourth carrier signal with a fourth input signal to provide a fourth output signal, wherein the third and fourth input signals are derived based on a second modulating signal, and wherein the phase of the fourth carrier signal is not inverted by the fourth input signal; and
   a combiner operative to combine the first, second, third, and fourth output signals to provide a modulated signal, wherein the modulated signal comprises an inphase component formed by the first modulating signal and a quadrature component formed by the second modulating signal.

2. The integrated circuit of claim 1, further comprising:
   a first summer operative to sum the first modulating signal with an offset value to provide the first input signal;
   a second summer operative to sum an inverted version of the first modulating signal with the offset value to provide the second input signal;
   a third summer operative to sum the second modulating signal with the offset value to provide the third input signal; and
   a fourth summer operative to sum an inverted version of the second modulating signal with the offset value to provide the fourth input signal.

3. The integrated circuit of claim 2, wherein the offset value is selected based on an expected magnitude of the first and second modulating signals.

4. The integrated circuit of claim 3, wherein the offset value is a fixed value.

5. The integrated circuit of claim 3, wherein the offset value is a variable value.

6. The integrated circuit of claim 1, wherein the first, second, third, and fourth amplitude modulators are switching amplifiers.

7. The integrated circuit of claim 6, wherein the first, second, third, and fourth input signals vary power supplies of the switching amplifiers for the first, second, third, and fourth amplitude modulators, respectively.

8. The integrated circuit of claim 1, wherein each of the first, second, third, and fourth amplitude modulators is implemented with a supply modulated class E, class D, class F, class inverse-F, or class E/Fodd amplifier.

9. The integrated circuit of claim 1, further comprising:
   a quadrature splitter operative to receive a local oscillator (LO) signal and provide the first, second, third, and fourth carrier signals.

10. The integrated circuit of claim 1, wherein the first, second, third, and fourth carrier signals are 90 degrees out of phase of each other.

11. The integrated circuit of claim 1, wherein the first, second, third, and fourth amplitude modulators are implemented in complementary metal oxide semiconductor (CMOS).

12. The integrated circuit of claim 1, wherein the modulated signal is a CDMA signal.

13. The integrated circuit of claim 1, wherein the modulated signal is a GSM signal.

14. The integrated circuit of claim 1, wherein the first input signal comprises a non-inverted version of the first modulating signal, the second input signal comprises an inverted version of the first modulating signal, the third input signal comprises an inverted version of the second modulating signal, and the fourth input signal comprises a non-inverted version of the second modulating signal.

15. The integrated circuit of claim 1, wherein each of the first, second, third, and fourth amplitude modulators comprises
   first and second transistors operative to receive and amplify the carrier signal for the amplitude modulator, and
   a circuit block operative to receive the input signal for the amplitude modulator and to vary a supply voltage for the first and second transistors.

16. The integrated circuit of claim 15, wherein the circuit block for each amplitude modulator comprises a tank circuit operative to receive the input signal for the amplitude modulator and to vary the supply voltage for the first and second transistors.

17. The integrated circuit of claim 15, wherein the tank circuit for each amplitude modulator is further operative to pass desired components at a designated frequency and to filter out undesired components at other frequencies.

18. A device comprising:
   a quadrature splitter operative to receive a local oscillator (LO) signal and provide first, second, third, and fourth carrier signals; and
   a quadra-polar modulator operative to receive and amplitude modulate the first, second, third, and fourth carrier signals with first and second moditlating signals to provide a modulated signal, wherein the phases of the first, second, third, and fourth carrier signals are not inverted by the first and second modulating signals, and wherein the modulated signal comprises an inphase component formed by the first modulating signal and a quadrature component formed by the second modulating signal.

19. The device of claim 18, wherein the quadra-polar modulator includes
   a first amplitude modulator operative to modulate the first carrier signal with a first input signal to provide a first output signal,
   a second amplitude modulator operative to modulate a second carrier signal with a second input signal to provide a second output signal, wherein the first and second input signals are derived based on the first modulating signal, a third amplitude modulator operative to modulate a third carrier signal with a third input signal to provide a third output signal, a fourth amplitude modulator operative to modulate a fourth carrier signal with a fourth input signal to provide a fourth output signal, wherein the third and fourth input signals are derived based on the second modulating signal, and a combiner operative to combine the first, second, third, and fourth output signals to provide the modulated signal.

20. The device of claim 19, wherein the first, second, third, and fourth amplitude modulators are switching amplifiers.

21. The device of claim 19, wherein the first, second, third, and fourth input signals are derived based on the first and second modulating signals and an offset value, and wherein the offset value is selected based on an expected magnitude of the first and second modulating signals.

22. The device of claim 18, wherein the modulated signal is a CDMA signal.

23. An apparatus comprising:

means for amplitude modulating a first carrier signal with a first input signal to provide a first output signal, wherein the phase of the first carrier signal is not inverted by the first input signal;

means for amplitude modulating a second carrier signal with a second input signal to provide a second output signal, wherein the first and second input signals are derived based on a first modulating signal, and wherein the phase of the second carrier signal is not inverted by the second input signal;

means for amplitude modulating a third carrier signal with a third input signal to provide a third output signal, wherein the phase of the third carrier signal is not inverted by the third input signal;

means for amplitude modulating a fourth carrier signal with a fourth input signal to provide a fourth output signal, wherein the third and fourth input signals are derived based on a second modulating signal, and wherein the phase of the fourth carrier signal is not inverted by the fourth input signal; and means for combining the first, second, third, and fourth output signals to provide a modulated signal, wherein the modulated signal comprises an inphase component formed by the first modulating signal and a quadrature component formed by the second modulating signal.

24. The apparatus of claim 23, further comprising:

means for summing the first modulating signal with an offset value to provide the first input signal;

means for summing an inverted version of the first modulating signal with the offset value in provide the second input signal;

means for summing the second modulating signal with the offset value to provide the third input signal; and means for summing an inverted version of the second modulating signal with the offset value to provide the fourth input signal.

25. The apparatus of claim 23, wherein the modulated signal is a CDMA signal.

26. A method of performing modulation in a wireless communication system, comprising:

amplitude modulating a first carrier signal with a first input signal to provide a first output signal, wherein the phase of the first carrier signal is not inverted by the first input signal;

amplitude modulating a second carrier signal with a second input signal to provide a second output signal, wherein the first and second input signals are derived based on a first modulating signal, and wherein the phase of the second carrier signal is not inverted by the second input signal;

amplitude modulating a third carrier signal with a third input signal to provide a third output signal, wherein the phase of the third carrier signal is not inverted by the third input signal;

amplitude modulating a fourth carrier signal with a fourth input signal to provide a fourth output signal, wherein the third and fourth input signals are derived based on a second modulating signal, and wherein the phase of the fourth carrier signal is not inverted by the fourth input signal; and combining the first, second, third, and fourth output signals to provide a modulated signal, wherein the modulated signal comprises an inphase component formed by the first modulating signal and a quadrature component formed by the second modulating signal.

* * * * *